United States Patent [19]
Voss

[11] Patent Number: 6,031,177
[45] Date of Patent: Feb. 29, 2000

[54] SHADOWING TIMER FOR A PHOTOVOLTAIC SOLAR CELL ARRAY AND PHOTOVOLTAIC POWER SOURCE COMPRISING SAME

[76] Inventor: Paul B. Voss, 119 College Ave. Apt. #39, Somerville, Mass. 02144

[21] Appl. No.: 08/886,265

[22] Filed: Jul. 1, 1997

[51] Int. Cl.[7] .................................................. H01L 31/042
[52] U.S. Cl. .................... 136/244; 136/243; 136/246; 136/251; 136/259; 126/600; 126/602; 126/569; 126/683; 126/684; 126/698; 126/701; 126/702; 250/203.4; 250/205
[58] Field of Search ..................................... 136/243, 244, 136/246, 251, 259; 126/600, 602, 569, 683, 684, 698, 701, 702; 250/203.4, 205

[56] References Cited

U.S. PATENT DOCUMENTS

| | | | |
|---|---|---|---|
| 4,107,521 | 8/1978 | Winders | 250/203.4 |
| 4,151,408 | 4/1979 | Brown et al. | 250/203.4 |
| 4,453,534 | 6/1984 | Kazimir | 126/240 |
| 4,556,788 | 12/1985 | Hanak | 250/203.4 |
| 4,771,763 | 9/1988 | Wetzel, Jr. | 136/244 |

*Primary Examiner*—Alan Diamond
*Attorney, Agent, or Firm*—David J. Powsner; Choate, Hall & Stewart

[57] ABSTRACT

A photovoltaic power source includes a shadowing timer comprising at least one shadowing member (i.e. vane element) secured proximal to an array of photovoltaic solar cells electrically connected in series. The shadowing members are arranged such that they shadow individual solar cells or rows of cells as the sun moves through diurnal and annual cycles. The shadows cast by two or more vanes can modulate the array output power on two independent time scales: time of day and time of year. Because the individual solar cells are connected in series, a small shadow significantly reduces the array output power, thus enabling fine-scale temporal control.

26 Claims, 4 Drawing Sheets

SHADOWING TIMER FOR A PHOTOVOLTAIC SOLAR CELL ARRAY AND PHOTOVOLTAIC POWER SOURCE COMPRISING SAME

BACKGROUND

1. Field of Invention

This invention relates to photovoltaic solar cell arrays, specifically to a shadowing timer that controls the output power of a solar cell array on two independent time scales: time of day and time of year.

2. Description of Prior Art

Small photovoltaic solar cell arrays (one to one thousand Watts peak power) are an economical and reliable method of powering modest off-grid loads. These arrays are often connected directly to a load when used in ventilation, pumping, irrigation, and water circulation applications. Because of the direct electrical connection, these systems usually run during the entire time the solar cell array is exposed to direct sunlight. In some cases this long running time may not be necessary or desirable. A 3000-hour DC pump running 10 hours a day, for example, will exceed its rated lifetime in under a year. Over periods ranging from years to decades, the cost of maintenance and component replacement can far exceed the cost of the solar cell array.

Furthermore, many applications only require energy during a certain time of year or certain time of day. For example, an attic ventilation fan should run only during the summer months, while a defrosting or de-icing device only requires energy during the winter. It may only be necessary to run an irrigation pump for an hour each sunny day, and it may be preferable to shut the pump off completely during the winter to prevent ice damage.

Previous methods of limiting component operation have relied on electrical switching devices such as timers, float switches, thermostats, and user-operated switches. Timers drift and usually require a continuous power supply. Float switches, thermostats, and other feedback controls increase the cost and complexity of a system and are prone to failure. Malfunctioning feedback controls can damage system components and endanger other property.

U.S. Pat. No. 4,453,534 to Kazimir (1984) for a solar water heating system illustrates the use of both a timer and a photovoltaic solar cell array as alternative methods for controlling a circulation pump. Kazimir suggests using "a timer set to turn said pump on at a predetermined time of day and to turn said pump off at a second predetermined time of day." When Kazimir substitutes a solar cell array in place of the timer, he does not attempt to optimize the system; the pump simply runs whenever the array is exposed to sufficient sunlight.

The prior use of shading devices is also relevant to the shadowing timer. Shading devices, such as vanes, boxes, and tubes, are widely used to shadow light sensors and thereby increase the sensor sensitivity to the angle of incident light. U.S. Pat. No. 4,107,521 to Winders (1978) and U.S. Pat. No. 4,151,408 to Brown et al. (1979) incorporate sensor shades to improve the accuracy of solar tracking devices. The solar tracking apparatus in U.S. Pat. No. 4,556,788 to Hanak (1983) uses shadow vanes to shade one half of a solar cell array, thereby generating a differential voltage that drives a solar tracking apparatus. Hanak's apparatus does not function as a timer and does not derive any benefit from the changing direction of incident light as the sun moves through diurnal and annual cycles.

SUMMARY OF THE INVENTION

A shadowing timer according to the invention is based on the same geometrical and mathematical principles that govern the design of sundials. It partially shades a solar cell array, reducing the array's output power significantly except during a predetermined time of day and/or time of year. Because it is completely passive in its operation, the shadowing timer is inexpensive, durable, and extremely reliable.

To facilitate description of the shadowing timer, an "off" period is here defined as the time, at a hypothetical cloudless site, when the output power of a solar cell array is reduced significantly by a shadowing timer. An "on" period is defined as the time, at a hypothetical cloudless site, that the output power is substantially unaffected the shadowing timer. The "on/off transition" periods are defined as those time periods between the on and off periods.

A "hypothetical cloudless site" has the same latitude and longitude as an actual site but is completely free from overhead clouds at all times of the day and at all times of the year. A "shadowing member" is a member that casts a shadow that falls on the operative surface of the solar cell array at least once each year at a hypothetical cloudless site. A "shadowing vane" or simply "vane" is an opaque planar shadowing member. "Solar noon" is defined as the time when the sun reaches its highest point above the horizon. The above definitions of the terms "on", "off", "on/off transition", "shadowing member", "shadowing vane", "vane", "hypothetical cloudless site", and "solar noon" are used throughout the specification, claims, and figures.

In one aspect, a shadowing timer according to the invention provides at least one shadowing member proximal to an array of photovoltaic solar cells that are secured in a fixed position and that can be connected in series. The shadowing member or members shade at least a significant fraction of at least one of the cells in the array during at least one predetermined off period each year. As a result, the power produced by the array is significantly reduced by the shadowing member during the off period, and substantially unaffected by the shadowing member at all other times.

As an example, the array can be a four-by-nine-cell array laminated to the underside of a sheet of glass and producing substantially 10 Watts peak power. The plane of the array can be oriented due south and inclined at an angle from horizontal equal to the latitude of the site. The shadowing member can be a sheet of 0.020-inch-thick stainless steel oriented north-south and perpendicular to the plane of the array. The stainless steel sheet can be five inches tall. In this example, the solar panel "on" period will last substantially one hour and will be centered around solar noon.

In another aspect, the shadowing timer according to the invention provides one or more shadowing members that are substantially opaque and substantially planar. In another aspect, the invention provides a shadowing timer as described above including one or more opaque planar members that are substantially perpendicular to the plane of the array and oriented substantially north-south. As a result, the shadowing timer produces at least one on period and at least one off period each day during a significant fraction of the year.

In another aspect, the invention provides a shadowing timer as described above including one or more opaque planar members that are substantially perpendicular to the plane of the array and oriented substantially east-west. As a result, each year the shadowing timer produces at least one off period that lasts throughout the daylight hours of one or more sequential days.

In another aspect, the invention provides a shadowing timer as described above including one or more opaque planar members that are oriented east-west and one or more opaque planar members that are oriented north-south. As a result, the shadowing timer produces at least one on period and at least one off period each day during a significant fraction of the year, and at least one off period each year that lasts throughout the daylight hours of one or more sequential days.

In still another aspect, the invention provides a shadowing timer as described above including at least one opaque planar member adjacent to the array and tilted away from the array by an angle less than 90 degrees from perpendicular to the array. As a result, the length of the on period is increased without degrading the sharpness of the on/off transitions. In another aspect the shadowing timer provides one or more shadowing members in addition to one or more reflective or refractive surfaces that act as concentrators. As a result, the irradiance incident on the array during the on period is increased and the array output power is greater than it would be without the shadowing timer/concentrator.

Still other aspects of the invention provide a photovoltaic power source comprising a photovoltaic solar array in combination with a shadowing timer of the type described above.

Accordingly, several advantages of the shadowing timer invention are:

(a) it can restrict the on period of a photovoltaic solar cell array to a predetermined time of the day;
(b) it can restrict the on period of a photovoltaic solar cell array to a predetermined time of the year;
(c) it controls the duration of the on period;
(d) it controls the duration of the on/off transition;
(e) it controls the magnitude of the power attenuation during the off period;
(f) it can incorporate a reflective or refractive surface to increase the array output power during the on period;
(g) it resists trapping leaves and other debris;
(h) it is mechanically strong and able to resist high winds, ice, snow, vandalism, and other natural and unnatural acts.;
(i) it is completely passive and requires no additional hardware or power supplies.

Further advantages of the shadowing timer are that it is simple to install, that it requires minimal modification of the solar cell array, that it can be manufactured inexpensively from conventional materials, and that it resists degradation in the outdoor environment. Still further advantages will become apparent from consideration of the ensuing drawings and description, or may be learned by practice of the invention.

BRIEF DESCRIPTION OF THE DRAWINGS

A better appreciation of the invention may be attained by reference to the drawings in which.

DETAILED DESCRIPTION OF THE ILLUSTRATED EMBODIMENT

Reference numerals in Drawings

| | | | |
|---|---|---|---|
| 10 | photovoltaic solar cell array | 11 | array frame |
| 12 | photovoltaic solar cells | 14 | diurnal vane or vanes |
| 16 | annual vane or vanes | 18 | fastener (nut and bolt) |
| 20 | concentrator | | |

Description—FIGS. 1 to 7

Figure 1:
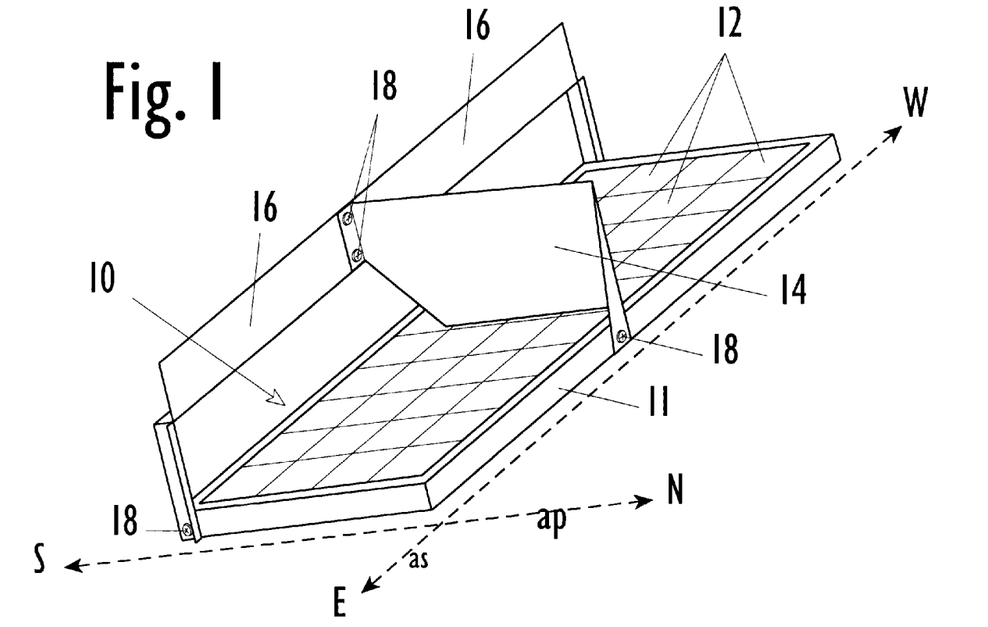
FIG. 1 is an isometric illustration of a photovoltaic power source with a shadowing timer according to the invention attached to a series-connected solar cell array in such a manner that the array is on only during the middle of the day, and only during the summer.

One embodiment of the invention is illustrated in FIG. 1. It includes a photovoltaic solar cell array 10 comprising an extruded aluminum frame 11 and individual photovoltaic solar cells 12 electrically connected in series and laminated to the underside of a sheet of glass. In the preferred embodiment, amorphous silicon solar cells are used because they are relatively inexpensive, have good conversion efficiencies, and exhibit extremely high resistance when nonconductive (i.e. when shadowed) as compared to crystalline cells.

In the present embodiment, the plane of the solar cell array is parallel to both the earth's polar axis $a_p$ local seasonal axis $a_s$. The polar axis is the axis of rotation of the earth about its center of mass. The seasonal axis represents the variation of the earth's polar axis with respect to the sun during the annual cycle. These variations are +/−23.5 degrees from the position that occurs during the equinox.

Equivalently the solar cell array is inclined directly towards the equator (due south in the northern hemisphere) at an angle from horizontal equal to the latitude of the site. The term "reference orientation" will be used to describe this orientation. Thus, in the reference orientation on a cloudless day, the array will deliver maximum power at solar noon.

A shadowing edge is defined as the edge of a shadowing member that casts the moving shadow boundary responsible for turning the solar cell array on or off. In the illustrated embodiments, the shadowing edges are the substantially linear edges of opaque planar members. However, many other materials and objects contain at least one shadowing edge and are therefore capable of functioning as shadowing timers. For example, the shadowing member need not be planar and need not be opaque. Transparent materials can refract the incident solar radiation and thereby produce a shadow that functions to control the operation of the solar cell array. The shadowing member does not even need to be a solid; a carefully-directed stream of water can function as a shadowing member.

In general, a diurnal vane 14 is a shadowing member having a shadowing edge substantially parallel to both the earth's polar axis and the solar cell array. An annual vane 16 is a shadowing member having a shadowing edge substantially perpendicular to the earth's polar axis and substantially parallel to the solar cell array. When the modifier "substantially" is applied to the terms parallel and perpendicular, it is interpreted to mean "within substantially 23.5 degrees of".

The definitions of the terms "shadowing edge", "substantially parallel", "substantially perpendicular", "diurnal vane" and "annual vane" are used throughout the specification, claims, and figures, and are not restricted to the present embodiment.

In the preferred embodiment of FIG. 1, the diurnal vane is constructed from a single sheet of material of uniform cross section that is bent permanently into the form shown. As an example, the diurnal vane could be manufactured from weather-resistant sheet metal such as 0.020 inch stainless steel or 0.030 inch anodized aluminum. The north edge of the diurnal vane is bent perpendicular to the diurnal vane and fastened to the north side of the array frame using a conventional fastener such as a nut and bolt, a rivet, a sheet metal screw, or a weld 18. The south edge of the diurnal vane is bent perpendicular to the diurnal vane and is attached to the annual vane with the conventional fastener. The diurnal vane is perpendicular to the plane of the array and is aligned with the local meridian (i.e. north-south). The plane of the diurnal vane intersects the solar cell array between rows of solar cells as shown. The diurnal vane is uniform in height (as measured perpendicularly from the plane of the array).

In the embodiment of FIG. 1, the annual vane is constructed from the same material as the diurnal vane. The east and west vertical sections of the annual vane are strengthened by a right-angle bend away from the solar cell array. The horizontal portion of the annual vane is also strengthened by a right-angle bend as shown. The u-shaped portion of the annual vane (from vertical post to horizontal span to vertical post) is continuous. The annual vane is attached to the east and west sides of the array frame using the conventional fasteners. The annual vane is aligned with the local parallel of latitude (i.e. east-west). The plane of the annual vane is perpendicular to the plane of the solar cell array and intersects the lower (south) edge of the bottom (south) row of solar cells. The annual vane is uniform in height (as measured perpendicularly from the plane of the array).

Additional embodiments are shown in FIGS. 2, 3, 4, 5, 6, and 7. The fasteners and the materials that comprise the vanes are the same as in FIG. 1. In all cases, the solar cell array is in the reference orientation described above.

Figure 2:
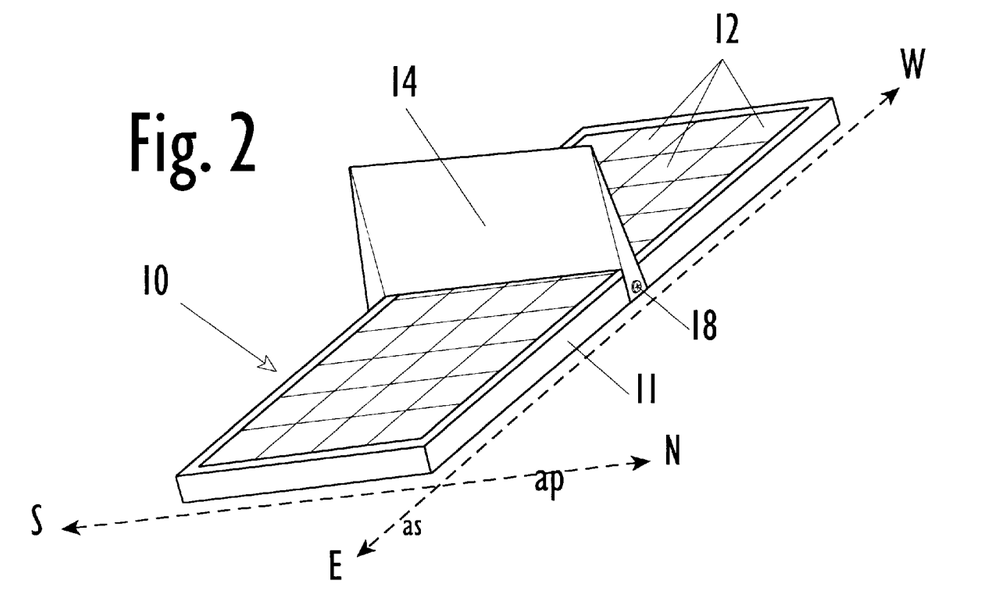
FIG. 2 is an alternate embodiment of the invention that enables the solar cell array all year long, but only for a fixed period each day.

FIG. 2 shows the solar cell array with the diurnal vane only. The diurnal vane is formed from a single sheet of material. The north edge of the diurnal vane is bent perpendicular to the diurnal vane and to the west. The south edge of the diurnal vane is bent perpendicular to the diurnal vane and to the east. The diurnal vane is attached to the north and south sides of the array frame using the conventional fasteners.

Figure 3:
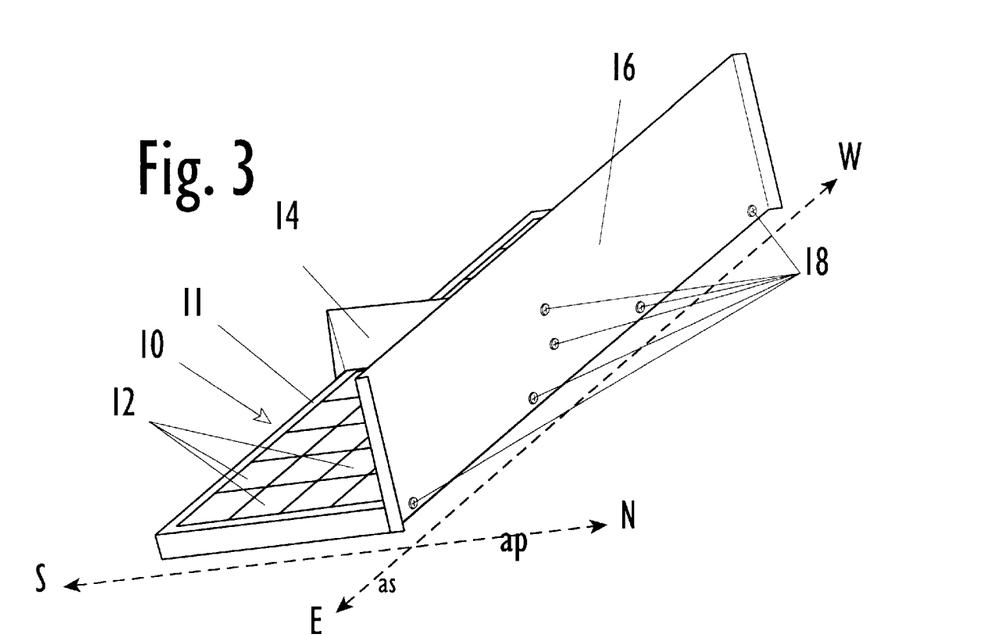
FIG. 3 is an embodiment of the invention that enables the solar cell array for a large fraction of the day during the winter.

FIG. 3 shows the annual vane affixed to the north (upper) side of the array frame using the conventional fasteners. The annual vane is formed from a single sheet of material with its east and west edges bent perpendicular to the annual vane and away from the solar cell array. The plane of the annual vane is slightly to the north of the top (north) row of solar cells. The small diurnal vane is similar to the diurnal vane in FIG. 1 with the one exception that the diurnal vane is uniform along the array (i.e. no notch is cut out adjacent to the annual vane). The north edge of the diurnal vane is bent perpendicular to the diurnal vane and to the east, and fastened to the annual vane using the conventional fasteners.

Figure 4:
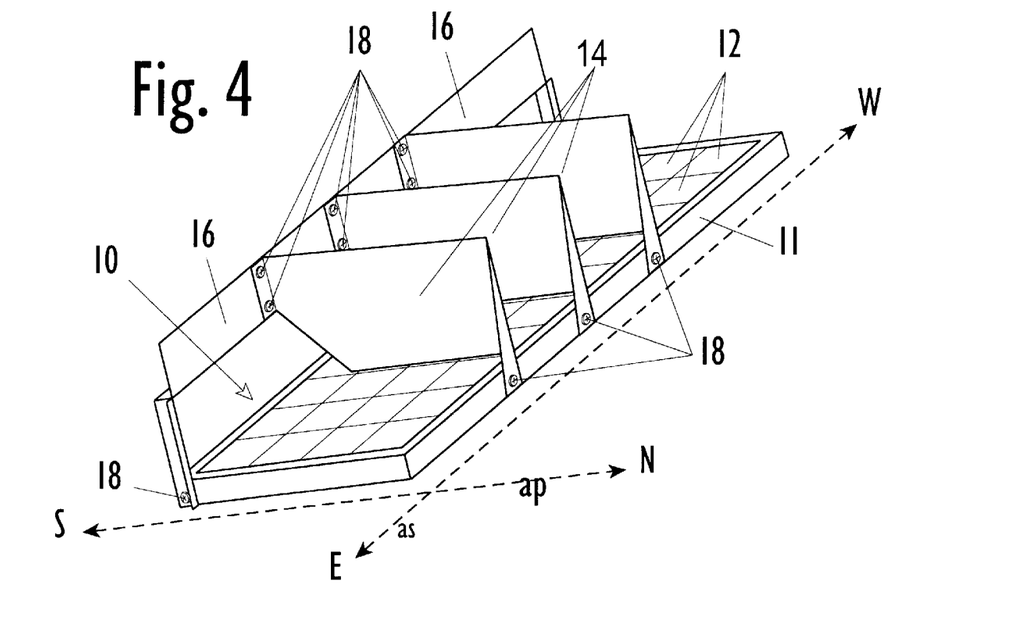
FIG. 4 is an embodiment of the invention that uses additional shadowing vanes to enhance power attenuation during the off period.

FIG. 4 shows additional parallel diurnal vanes connected to the lower (south) annual vane. These additional diurnal vanes are attached to the annual vane in the same manner as the single diurnal vane in FIG. 1. Each of the diurnal vanes intersects the solar cell array between rows of solar cells as shown.

Figure 5:
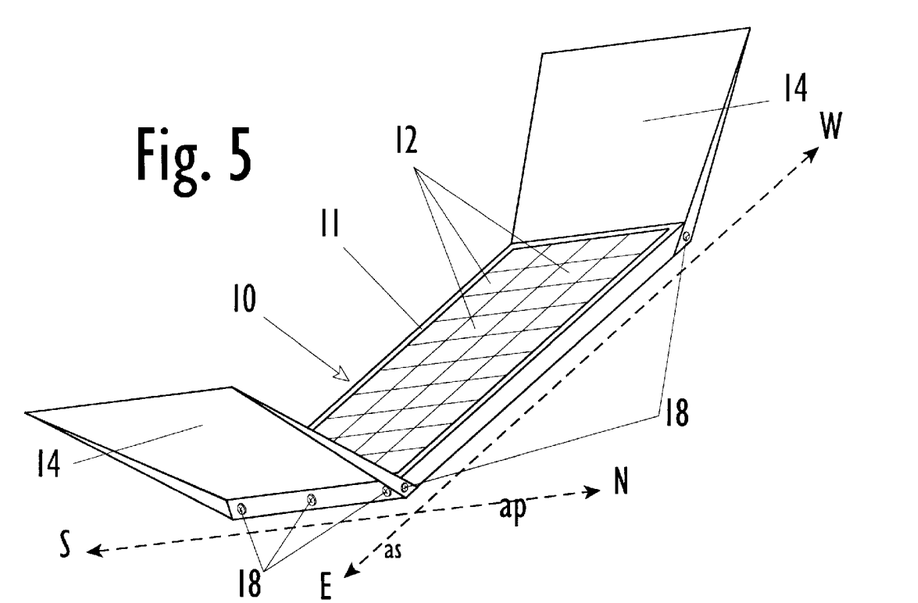
FIG. 5 is an alternate embodiment of the invention that uses angled shadowing vanes to extend the on period without increasing the length of the transition period.
Figure 6:
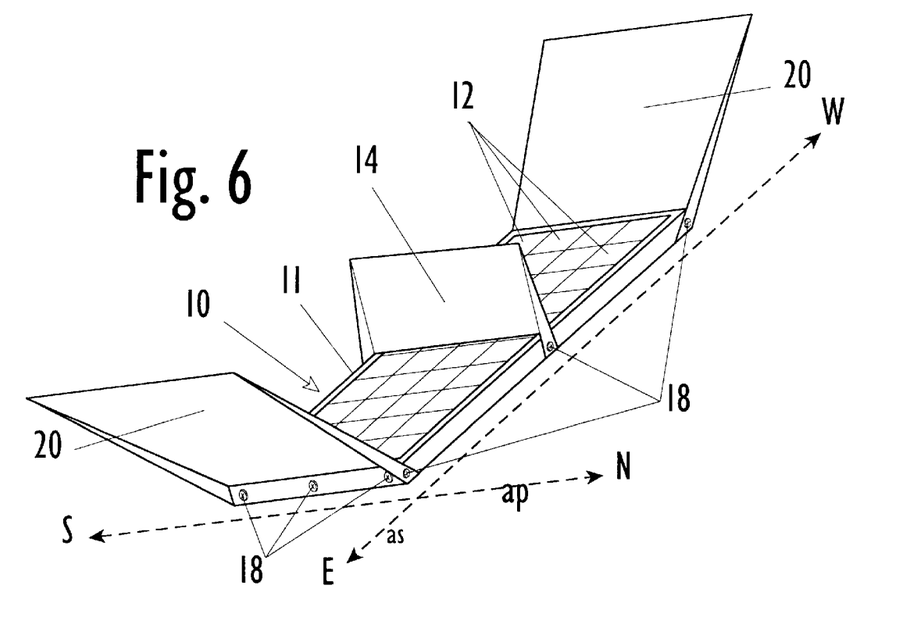
FIG. 6 is an embodiment of the invention that incorporates a reflective surface acting as a concentrator to increase the output power of the array during the on period.

FIG. 5 shows two angled diurnal vanes, each formed from a single sheet of material. The north and south edges of each diurnal vane are bent down and perpendicular to the plane the diurnal vane, and are fastened to the array frame using the conventional fasteners. The edges of the diurnal vanes that face the solar cell array are bent down at an angle less than ninety degrees and attached to the array frame using the conventional fasteners. FIG. 6 shows the single diurnal vane with a set of concentrators 20. In this embodiment, the concentrators are formed in the same manner as the diurnal vanes in FIG. 5, except that they have upper surfaces that are reflective or refractive. This surface could be created by polishing, electroplating, lamination, or any other conventional method for increasing reflection or refraction.

Figure 7:
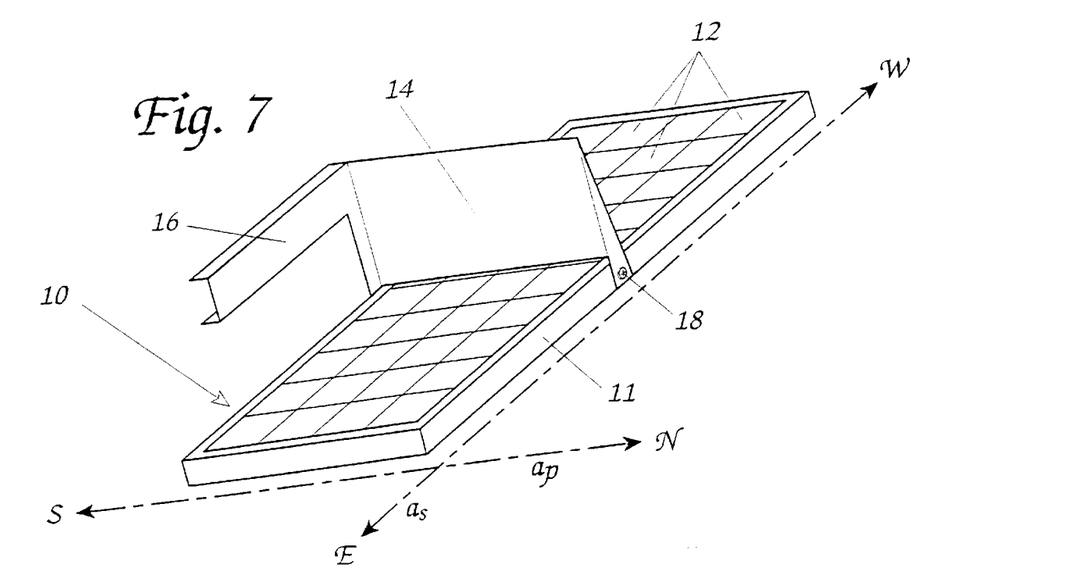
FIG. 7 is an embodiment of the invention that is designed to minimize trapped debris.

FIG. 7 shows the solar cell array with the diurnal and annual vanes formed from a single sheet of material. The annual vane is supported only at one end and is strengthened by right-angle bends away from the array as shown. The plane of the annual vane is slightly to the south of the bottom (south) row of solar cells.

From the description above, a number of advantages of the shadowing timer and a photovoltaic power source incorporating the same become evident:

(a) The vanes have three-dimensional forms that make them mechanically strong and resistant to bending;

(b) The vanes are supported in such a manner that they resist rotation about the axes of the fastening hardware;

(c) When two or more vanes are used, the vanes mutually support each other;

(d) The vanes are designed to minimize material waste during manufacture. The unformed vanes are nearly rectangular and have few cutouts;

(e) The vanes attach to the solar cell array with little modification of the array frame;

(f) The vanes are designed so that they do not capture or collect debris. The annual vane will actually shield the solar cell array from snow and ice when it is positioned for winter operation of the array.

Still further advantages of the invention are evident from the description of its operation below.

Operation—FIGS. 1 to 8

A photovoltaic power source and shadowing timer according to the invention uses diurnal and annual vanes to control output power of a solar cell array on two independent time scales: time of day and time of year.

The position of the sun (as seen from the earth) rotates about the earth's polar axis by 15 degrees per hour. The diurnal vane translates this rotation into a shadow that shades the solar cell array and turns it off except when the sun's rays are nearly parallel to the diurnal vane.

The position of the sun also varies seasonally. At local solar noon of the summer solstice, the sun's position is 23.5 degrees north of the equatorial plane, while at local solar noon of the winter solstice, the sun is displaced by 23.5 degrees to the south. The annual vane translates this seasonal variation into a shadow that shades the solar cell array and turns it off for a predetermined fraction of the year.

Figure 8:
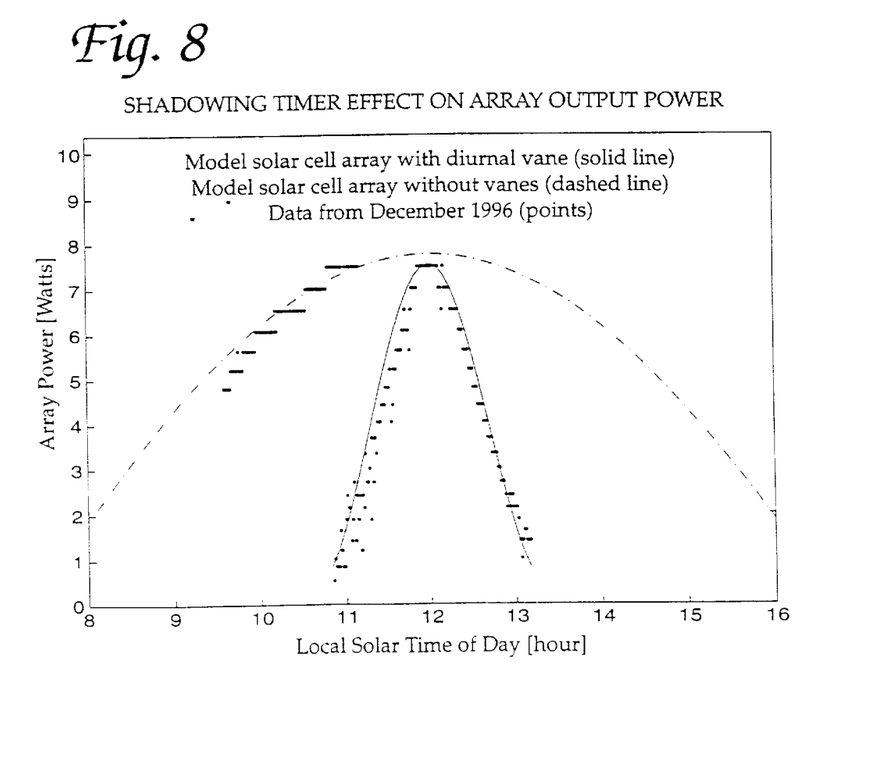
FIG. 8 is a graphical illustration of the performance characteristics of a solar cell array with of the shadowing timer shown in FIG. 1.

For the embodiment shown in FIG. 1, the duration of the diurnal on period can be predicted using a formula derived from the simplified geometry of earth's rotation and orbit around the sun. The solar cell array is in the reference orientation and the array is assumed to be fully off when the shadow cast by the diurnal vane covers more than one third of a row of solar cells. The duration of the on period in hours (t) is determined by the formula, $$t \approx \frac{24}{\pi} \text{TAN}^{-1}\left(\frac{l_1}{3h_1}\right) \quad (1)$$

where $h_1$ is the height of the diurnal vane and $l_1$ is the length of a single solar cell in the east-west direction. Note that $l_1$ and $h_1$ must be in the same units (e.g. centimeters, inches, etc.). All inverse trigonometric functions are taken in radians. As an example, if a diurnal vane five inches tall is attached to a solar cell array having cells two inches across, the solar cell array will be on for substantially one hour each day. FIG. 8 shows actual data for a five-inch-tall diurnal vane mounted on a nominal 10-Watt solar cell array operating in December. In general, taller diurnal vanes produce shorter on periods and more rapid transitions.

For the embodiment shown in FIG. 1, the timing of the annual on period can also be determined using a geometrical derivation. The fractional times of the year ($\chi$) when the solar cell array is substantially midway in transition between on and off are determined by the formula, $$\chi \approx \frac{1}{2\pi} \text{COS}^{-1}\left(2.44 \cdot \text{TAN}^{-1}\left(\frac{l_2 + 3d_2}{3h_2}\right)\right) \quad (2)$$

where $l_2$ is the length of a single solar cell in the north-south direction in the plane of the array and $h_2$ is the perpendicular distance from the plane of the array to the top of the annual vane. The displacement ($d_2$) is the perpendicular distance between the plane of the annual vane and an imaginary plane that is perpendicular to the front face of the array and intersects the lower (south) edge of the bottom (south) row of solar cells. As an example, an annual vane that is five inches tall and mounted directly above the lower edge of the solar cell array ($d_2=0$) gives the solution $\chi=0.2$ and $\chi=0.8$. This annual vane will turn the array on in March and off in October. Note that $\chi=0$ and $\chi=1$ represent the winter solstice (December 22), while $\chi=0.5$ represents the summer solstice (June 21).

Orientations of the solar cell array and affixed shadowing vanes that deviate from the reference orientation may be desirable. For example, the solar cell array and shadowing vanes can be rotated about the polar axis to select a particular time of day when the array will operate. For every 15 degrees of rotation to the east of the reference orientation, the time of maximum power is decreased by one hour. Rotation towards the west has an equal and opposite effect. Rotation of the solar cell array about the polar axis has no effect on the calculations for the annual or diurnal vanes and therefore no vane modifications are necessary.

The solar cell array can also be rotated about the seasonal axis by up to +/−23.5 degrees from the reference orientation to maximize the power at a particular time of year. For example, if the annual vane is arranged as in FIG. 1 so that the solar cell array only operates during the summer months (April through September), then it would be desirable to tilt the array to the north by substantially twelve degrees. Rotation of the array about the seasonal axis mandates new calculations for the height and position of the annual vane, and the height of the diurnal vane. For small rotations from the reference position (less than substantially ten degrees), the corrections to the diurnal vane are not likely to be important.

When the annual vane and the diurnal vane are used together, as in FIG. 1, they complement each other functionally. Since the diurnal vane only allows the solar cell array to operate during a predetermined portion of the day, the annual vane only needs to function during that time interval. Similarly, the diurnal vane only needs to function during the time of year set by the annual vane. Under these conditions, the design of both vanes can be simplified.

Several other embodiments of the vane attachment are shown in FIGS. 2 through 7. FIG. 2 shows the use of the diurnal vane only. This configuration allows the solar cell array to produce power throughout the year for a fixed period each day. FIG. 3 shows an annual vane designed to turn the array on only during the winter. A small diurnal vane is used only to prevent the annual vane from being defeated early in the morning or late in the afternoon. FIG. 4 illustrates the use of additional diurnal vanes to decrease the power during the off period.

FIG. 5 shows a symmetrical pair of angled diurnal vanes. These vanes allow independent control over the length of the on period and the rate of the on/off transition. Longer vanes produce a faster transition, while increasing angle from vertical lengthens the on period.

FIG. 6 shows the use of concentrators that are similar in design to the diurnal vanes of FIG. 5. These concentrators reflect light onto the surface of the solar cell array, increasing its maximum power by substantially fifty percent. Larger concentrators would further increase the maximum power, but may require additional cooling mechanisms for the array. Since the concentrator only needs to function during the on period when the sun is in a predetermined range of positions, conventional tracking devices are not necessary. The concentrator used in this manner provides an inexpensive and highly reliable method of increasing the maximum power output of the solar cell array. The diurnal vane used in conjunction with a concentrator allows a small array to drive a comparatively large load on a daily basis. Similar concentrators on the top (north) and bottom (south) of the solar cell array would allow seasonal timing.

FIG. 7 shows the diurnal and annual vane formed from a single sheet of material. This open form is designed to minimize the entrapment of leaves, sticks and other debris.
Summary, Ramifications, and Scope The reader will note that the shadowing timer according to the invention can significantly increase the functionality of a photovoltaic solar cell array. The shadowing timer controls output power of a solar cell array on two independent time scales: time of day and time of year. Combining the functional elements of the sundial and the photovoltaic solar cell array, the shadowing timer is inexpensive, reliable, and suitable for a wide range of applications.

The height and position of the timer vanes, in conjunction with the orientation of the solar cell array, set the timing periods. Variations on the basic vane design provide additional control. The use of angled vanes allows the duration of the on period to be set independently of the rate of transition between the on and off periods. Additional, parallel vanes serve to decrease the power during the off period, while a simple concentrator can boost the power, during the on period. The use of a concentrator is particularly advantageous because no tracking mechanism is necessary.

The solar cell array with a shadowing timer is ideally suited for loads that require power only during a fixed period each day, or only during certain times of year. Such loads include water pumping and irrigation applications where a timer can minimize unnecessary wear on the pump and prevent operation during the winter. Many other applications are likely to emerge as the full scope of the present invention is realized.

Although the description above contains many specificities, these should not be construed as limiting the scope of the invention. The figures and description merely provide an illustration of some of the presently preferred embodiments of the shadowing timer. Combinations and modifications of the above embodiments may in many cases be advantageous for a particular application. For example, the shadowing members (i.e. vanes) could be attached to the array frame using clamps, or even mounted on a separate structure entirely. The vanes could be slotted so their position and height can be adjusted. Refinements in the shape and form of the vanes could increase their strength or even modify the performance of the timer. Vanes that are rounded, notched, cutout, or simply further removed from the solar cell array would provide additional flexibility. With appropriate modifications, the solar cell array could be turned on and off several times during the day or during the year. Additionally, the array could be or turned on at different power levels at different times of the day or year.

It is not even required that the shadowing members be vanes. Many forms will cast a controlled shadow and can be properly positioned to act as shadowing timers. Such forms include, but are not limited to, objects such as trees, buildings and landscape features with shadowing edges that are substantially parallel or substantially perpendicular to the earth's polar axis. The precise and calculated placement of a photovoltaic solar cell array in relation to these and other landscape features is within the realm of the shadowing timer invention.

Thus, the scope of the invention should be determined by the appended claims and their legal equivalents, rather than by the examples given.

In view of the foregoing, what I claim is:

1. A photovoltaic power source comprising:
   a plurality of photovoltaic solar cells electrically coupled in an array that is secured in a fixed orientation substantially parallel to the earth's polar axis,
   a shadowing member proximal said array that passively shadows at least a significant fraction of at least one of said cells during at least one off period and exposes all said cells substantially completely to direct sunlight during at least one on period each year at a hypothetical cloudless site,
   whereby the power produced by said array is significantly reduced by said shadowing member during said off period and is substantially unaffected by said shadowing member during said on period.

2. The power source of claim 1 wherein said shadowing member includes at least one opaque planar member.

3. The power source of claim 2 wherein at least one said planar member is substantially perpendicular to said array.

4. The power source of claim 2 wherein at least one said planar member is substantially adjacent to said array and tilted away from said array by an angle less than ninety degrees from perpendicular, such that said on period is increased by increasing said angle.

5. The power source of claim 2 wherein at least one said planar member is positioned at sufficient distance from said array as to allow foreign debris from the group consisting of leaves and twigs to pass between said array and said planar member.

6. The power source of claim 2 wherein at least two said planar members are joined and mutually support each other.

7. The power source of claim 1 wherein said shadowing member includes a diurnal vane that produces at least one off period and at least one on period each day during at least a significant fraction of the year.

8. The power source of claim 1 wherein said shadowing member includes an annual vane that produces at least one off period that lasts throughout the daylight hours of one or more sequential days.

9. The power source of claim 1 wherein said shadowing member includes an annual vane and a diurnal vane that are used in combination such that at least one off period and at least one on period occur each day during at least a significant fraction of the year and at least one off period lasts throughout the daylight hours of one or more sequential days.

10. The power source of claim 1 wherein said cells comprise a rectangular grid of coplanar amorphous silicon photovoltaic solar cells secured to a light transparent medium.

11. The power source of claim 1 wherein a concentrator increases the solar irradiance incident on said array at least during said on period.

12. The power source of claim 1 wherein the photovoltaic solar cells in the array are electrically connected in series.

13. A shadowing timer for a photovoltaic solar cell array comprising:
   a plurality of photovoltaic solar cells serially connected in an array that is secured in a fixed orientation substantially parallel to lie earth's polar axis,
   at least one shadowing member proximal to said array and positioned such that at least one shadowing edge of said shadowing member is located between the sun and said array during at least one off period each year,
   whereby the power produced by said array is significantly reduced by said shadowing member during said off period and is substantially unaffected by said shadowing member during an on period.

14. The shadowing timer of claim 13 wherein said shadowing edge is substantially linear and substantially parallel to the earth's polar axis.

15. The shadowing timer of claim 13 wherein said shadowing edge is substantially linear and substantially perpendicular to the earth's polar axis.

16. The shadowing timer of claim 13 wherein at least one said shadowing member is positioned at sufficient distance from said array as to allow foreigi debris from the group consisting of leaves and twigs to pass between said array and said shadowing member.

17. The shadowing timer of claim 13 wherein at least two shadowing members are joined and mutually support each other.

18. The shadowing timer of claim 13 wherein said cells comprise a rectangular grid of coplanar amorphous silicon photovoltaic solar cells secured to a light transparent medium.

19. The shadowing timer of claim 13 further including a reflective or refractive surface acting as a concentrator to increase the solar irradiance incident on said array.

20. The shadowing timer of claim 13 wherein said shadowing member is opaque.

21. The shadowing timer of claim 13 wherein said shadowing member is planar.

22. A method of photovoltaic power generation comprising:
   securing a plurality of electrically coupled photovoltaic solar cells in a fixed orientation substantially parallel to the earth's polar axis,
   passively shadowing a substantial fraction of at least one of said cells during at least one off period and exposing all said cells substantially completely to direct sunlight during at least one on period each year at a hypothetical cloudless site, whereby the power produced by said array is substantially reduced by such passive shadowing during said off period and is substantially unaffected by such passive shadowing durng said on period.

23. The method of claim 22 wherein said shadowing step includes shadowing a substantial fraction of at least at least one of said cells with at least one opaque planar member.

24. The method of claim 22 wherein said shadowing step includes shadowing a substantial fraction of at least at least one of said cells with a diurnal vane that produces at least one off period and at least one on period each day during at least a significant fraction of the year.

25. The method of claim 22 wherein said shadowing step includes shadowing a substantial fraction of at least at least one of said cells with an annual vane that produces at least one off period that lasts throughout the daylight hours of one or more sequential days.

26. The method of claim 22 wherein said shadowing step includes shadowing a substantial fraction of at least at least one of said cells with an annual vane and a diurnal vane that are used in combination such that at least one off period and at least one on period occur each day during at least a significant fraction of the year and at least one off period lasts throughout the daylight hours of one or more sequential days.

* * * * *